(12) United States Patent
Nakao et al.

(10) Patent No.: US 8,164,197 B2
(45) Date of Patent: Apr. 24, 2012

(54) SEMICONDUCTOR DEVICE HAVING MULTILAYER INTERCONNECTION STRUCTURE

(75) Inventors: Yuichi Nakao, Kyoto (JP); Satoshi Kageyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 127 days.

(21) Appl. No.: 12/222,309

(22) Filed: Aug. 6, 2008

(65) Prior Publication Data

US 2009/0079086 A1  Mar. 26, 2009

(30) Foreign Application Priority Data

Aug. 7, 2007 (JP) ................................. 2007-205628
Aug. 20, 2007 (JP) ................................. 2007-213694
Aug. 5, 2008 (JP) ................................. 2008-202147

(51) Int. Cl.
*H01L 23/535* (2006.01)

(52) U.S. Cl. ................. 257/776; 257/773; 257/E23.143

(58) Field of Classification Search .......... 257/773–776, 257/E23.141, E23.144
See application file for complete search history.

(56) References Cited

U.S. PATENT DOCUMENTS

2005/0042827 A1* 2/2005 Hashimoto et al. ........... 438/258
2008/0251925 A1* 10/2008 Lin et al. ....................... 257/758

FOREIGN PATENT DOCUMENTS

JP  11-312735  11/1999
JP  2000-200905  7/2000

* cited by examiner

*Primary Examiner* — Michelle Mandala
*Assistant Examiner* — Raj R Gupta
(74) *Attorney, Agent, or Firm* — Rabin & Berdo, P.C.

(57) ABSTRACT

A semiconductor device according to the present invention includes: a first interlayer dielectric film; a lower wire formed on the first interlayer dielectric film; a second interlayer dielectric film formed on the first interlayer dielectric film and the lower wire; and an upper wire formed on the second interlayer dielectric film to intersect with a prescribed portion of the lower wire in plan view. The first interlayer dielectric film is provided with a groove dug from the upper surface thereof in a region including the prescribed portion in plan view. The prescribed portion enters the groove. At least a portion of the second interlayer dielectric film formed on the lower wire has a planar upper surface.

7 Claims, 10 Drawing Sheets

SEMICONDUCTOR DEVICE HAVING MULTILAYER INTERCONNECTION STRUCTURE

BACKGROUND OF THE INVENTION

The present invention relates to a semiconductor device having a multilayer interconnection structure.

DESCRIPTION OF RELATED ART

In general, the so-called multilayer interconnection structure is applied to a semiconductor device such as an LSI. In the multilayer interconnection structure, a plurality of wiring layers are stacked on a semiconductor substrate, and an interlayer dielectric film is interposed between the wiring layers.

If the patterns of wires formed on each wiring layer are complicated, lower and upper wires unavoidably intersect with each other in plan view. If the upper wire intersects with a prescribed portion of the lower wire in plan view, the distance between the lower and upper wires is minimized on the prescribed portion. Therefore, the interlayer dielectric film interposed between the wiring layers provided with the upper and lower wires respectively must be formed in a thickness (not causing dielectric breakdown) cable of maintaining the lower and upper wires insulated from each other on the prescribed portion of the lower wire.

The thickness of the interlayer dielectric film capable of maintaining the lower and upper wires insulated from each other depends on the material for the interlayer dielectric film and a potential difference caused between the lower and upper wires. In a semiconductor device including a high withstand voltage element, therefore, the thickness of the interlayer dielectric film is increased. When $SiO_2$ (silicon oxide) is employed as the material for the interlayer dielectric film and a potential difference of 600 V is formed between the lower wire and the upper wire, for example, a thickness of not less than 1 μm must be ensured for the interlayer dielectric film on the prescribed portion of the lower wire, since the dielectric withstand voltage of $SiO_2$ is about 6 to 7 MV/cm. If the interlayer dielectric film has a large thickness, a fine via hole cannot be formed in the interlayer dielectric film, and it is difficult to scale down the semiconductor device.

FIG. 9 is a sectional view schematically showing an example of a conventional semiconductor device employing a multilayer interconnection structure.

In the semiconductor device 500, a first interlayer dielectric film 52 is stacked on a semiconductor substrate (not shown). A lower wire 53 is formed on the first interlayer dielectric film 52. Dummy wires 54 are formed on the first interlayer dielectric film 52, on both sides of the lower wire 53 at intervals from the lower wire 53. A second interlayer dielectric film 55 is formed on the first interlayer dielectric film 52, the lower wire 53 and the dummy wires 54. An upper wire 56 is formed on the second interlayer dielectric film 55.

FIG. 10 is a plan view schematically showing the arrangement of the lower wire, the dummy wires and the upper wire.

The lower wire 53 and the upper wire 56 have portions intersecting with each other in plan view respectively. In other words, the upper wire 56 extends in a prescribed direction A above a prescribed portion 531 (shown in a hatched manner in FIG. 10) of the lower wire 53, and intersects with this prescribed portion 531 in plan view.

The dummy wires 54 are arranged on both sides of the prescribed portion 531 in the prescribed direction A at intervals from the prescribed portion 531. Each dummy wire 54 extends in a direction along the lower wire 53 longer than the width of the upper wire 56.

As shown in FIG. 9, an inclined portion 58 so inclined as to approach onto the first interlayer dielectric film 52 from above the lower wire 53 is formed on the surface of the second interlayer dielectric film 55 on the side opposite to the lower wire 53 with respect to each dummy wire 54 in plan view, due to a step formed by the upper surfaces of the dummy wire 54 and the first interlayer dielectric film 52.

On the surface of the second interlayer dielectric film 55, further, a recess 57 concaved toward the portion of the first interlayer dielectric film 52 located between the lower wire 53 and each dummy wire 54, due to a step formed by the upper surfaces of the lower wire 53 and the dummy wire 54 and the upper surface of the first interlayer dielectric film 52. If the lower wire 53 and the dummy wire 54 are remarkably separated form each other, the recess 57 is largely concaved. If the recess 57 is largely concaved, the minimum distance between the recess 57 and the lower wire 53 is so reduced that the insulation between the lower wire 53 and the upper wire 56 cannot be ensured. Therefore, the distance between the lower wire 53 and the dummy wire 54 is so set as not to allow formation of the recess 57 influencing the insulation between the lower wire 53 and the upper wire 56.

Following the scale-down of elements provided on the semiconductor substrate, the lower wire 53, the upper wire 56 and a via hole formed in the second interlayer dielectric film 55 are also scaled down. In order to form a fine via hole, the thickness of the second interlayer dielectric film 55 must be reduced. Therefore, the second interlayer dielectric film 55 is formed with the minimum thickness capable of maintaining the dielectric withstand voltage between the lower wire 53 and the upper wire 56.

In the inclined portion 58 of the second interlayer dielectric film 55, however, the minimum distance D between the surface thereof and a corner of the dummy wire 54 is smaller than the thickness of the second interlayer dielectric film 55, and hence dielectric breakdown may be caused between the portion of the upper wire 56 formed on the inclined portion 58 and the dummy wire 54. The interval between the lower wire 53 and the dummy wire 54 is set small in order to reduce the concaveness of the recess 57. If the dummy wire 54 and the upper wire 56 are short-circuited due to dielectric breakdown, therefore, dielectric breakdown is caused between the dummy wire 54 and the lower wire 53. As a result, the lower wire 53 and the upper wire 56 are short-circuited.

SUMMARY OF THE INVENTION

An object of the present invention is to provide a semiconductor device capable of improving the dielectric withstand voltage between a lower wire and an upper wire without entirely thickening (increasing the thickness of) an interlayer dielectric film interposed between the lower wire and the upper wire.

A semiconductor device according to one aspect of the present invention includes: a first interlayer dielectric film; a lower wire formed on the first interlayer dielectric film; a second interlayer dielectric film formed on the first interlayer dielectric film and the lower wire; and an upper wire formed on the second interlayer dielectric film to intersect with a prescribed portion of the lower wire in plan view. The first interlayer dielectric film is provided with a groove dug from the upper surface thereof in a region including the prescribed portion in plan view. The prescribed portion enters the groove. At least a portion of the second interlayer dielectric film formed on the lower wire has a planar upper surface.

Therefore, the thickness of the second interlayer dielectric film on the prescribed portion of the lower wire is larger than that of the second interlayer dielectric film on the remaining portion of the lower wire other than the prescribed portion by the depth of the groove. In other words, the second interlayer dielectric film is not entirely thickly formed but partially thickly formed on the prescribed portion of the lower wire. Therefore, the dielectric withstand voltage between the lower wire and the upper wire can be improved without entirely thickening (increasing the thickness of) the second interlayer dielectric film.

From another point of view, the dielectric withstand voltage between the lower wire and the upper wire depends on the thickness of the second interlayer dielectric film on the prescribed portion of the lower wire, and hence the thickness of the second interlayer dielectric film can be reduced on the portion of the lower wire other than the prescribed portion can be reduced while ensuring the insulation between the lower wire and the upper wire by setting the second interlayer dielectric film to a thickness capable of maintaining the insulation between the lower wire and the upper wire on the prescribed portion of the lower wire.

The semiconductor device may further include a semiconductor substrate whose surface is covered with the first interlayer dielectric film, and a contact hole for electrically connecting the lower wire and the semiconductor substrate with each other may be penetratingly formed in the first interlayer dielectric film. In this case, an insulating portion facing the groove so that the upper surface thereof provides the bottom surface of the groove is preferably formed on the surface of the semiconductor substrate.

The insulating portion is formed on the surface of the semiconductor substrate, whereby there is no apprehension that the groove reaches the semiconductor substrate even if the etching time is set in excess (in consideration of over etching) for reliably forming the contact hole. Consequently, the prescribed portion of the lower wire entering the groove and the semiconductor substrate can be prevented from conduction.

The contact hole and the groove can be simultaneously formed by forming a mask having openings corresponding to the contact hole and the groove respectively on the first interlayer dielectric film and etching the first interlayer dielectric film through this mask. According to the structure having the contact hole formed in the first interlayer dielectric film, therefore, the groove can be formed in the first interlayer dielectric film without increasing the number of the process steps.

The interlayer dielectric film may include a base layer film, in contact with the first interlayer dielectric film and the lower wire, having a uniform thickness and an embedded body embedded in a recess formed in the upper surface of the base layer film correspondingly to the groove so that the upper surface thereof is flush with the upper surface of the base layer film outside the groove.

The upper surface of the second interlayer dielectric film may be entirely planar. Further, the upper surfaces of the portions of the second interlayer dielectric film formed on the lower wire and the first interlayer dielectric film respectively may be planar, and these upper surfaces may form a step.

When the step is formed, the upper surface of the second interlayer dielectric film is inclined on a corner (intersection between the upper surface and the side surface) of the lower wire. The linear distance between the lower wire and the upper surface of the second interlayer dielectric film is minimized between the corner of the lower wire and the inclined portion of the upper surface of the second interlayer dielectric film, and this linear distance may be smaller than the thickness of the second interlayer dielectric film on the prescribed portion of the lower wire.

Therefore, the semiconductor device preferably further includes dummy wires formed on positions opposed to the upper wire on both sides of the prescribed portion in a direction where the upper wire extends on the prescribed portion. When these dummy wires are formed, the upper surface of the second interlayer dielectric film can be prevented from inclination on the corner of the lower wire, and the linear distance between the lower wire and the upper surface of the second interlayer dielectric film can be prevented from reduction below the thickness of the second interlayer dielectric film on the prescribed portion of the lower wire. Consequently, the dielectric withstand voltage between the lower wire and the upper wire can be improved.

A plurality of dummy wires are preferably provided on each side of the prescribed portion. Even if the upper surface of the second interlayer dielectric film is inclined on a corner of the dummy wire (outermost dummy wire) on a position farthest from the prescribed portion of the lower wire and the portion of the upper wire arranged on the inclined surface and the outermost dummy wire are short-circuited due to dielectric breakdown, therefore, the outermost dummy wire and the lower wire are not immediately short-circuited, due to another dummy wire interposed therebetween. Therefore, reliability against dielectric breakdown can be improved between the lower wire and the upper wire.

A semiconductor device according to another aspect of the present invention includes: a first interlayer dielectric film; a lower wire formed on the first interlayer dielectric film; dummy wires formed on the first interlayer dielectric film; a second interlayer dielectric film covering the lower wire and the dummy wires; and an upper wire formed on the second interlayer dielectric film to extend in a prescribed direction for intersecting with a prescribed portion of the lower wire in plan view. A plurality of dummy wires are provided on each side of the prescribed portion in the prescribed direction, and arranged at an interval in the prescribed direction on each side.

According to this structure, an inclined portion resulting from a step formed by the upper surface of the outermost dummy wire (farthest from the prescribed portion) and the upper surface of the first interlayer dielectric film is formed on the surface of the second interlayer dielectric film. The minimum distance between the surface of this inclined portion and the outermost dummy wire is smaller than the thickness of the second interlayer dielectric film, and hence the outermost dummy wire and the upper wire may be short-circuited when a high voltage is applied to the upper wire.

However, another dummy wire is interposed between the outermost dummy wire and the lower wire, and hence the outermost dummy wire and the lower wire are not immediately short-circuited even if the outermost dummy wire and the upper wire are short-circuited. Therefore, the insulation between the lower wire and the upper wire can be maintained. Consequently, the dielectric withstand voltage between the lower wire and the upper wire can be improved without thickening (increasing the thickness of) the second interlayer dielectric film.

The foregoing and other objects, features and effects of the present invention will become more apparent from the following detailed description of the embodiments with reference to the attached drawings.

DETAILED DESCRIPTION OF PREFERRED EMBODIMENTS

Embodiments of the present invention are now described with reference to the attached drawings.

Figure 1:
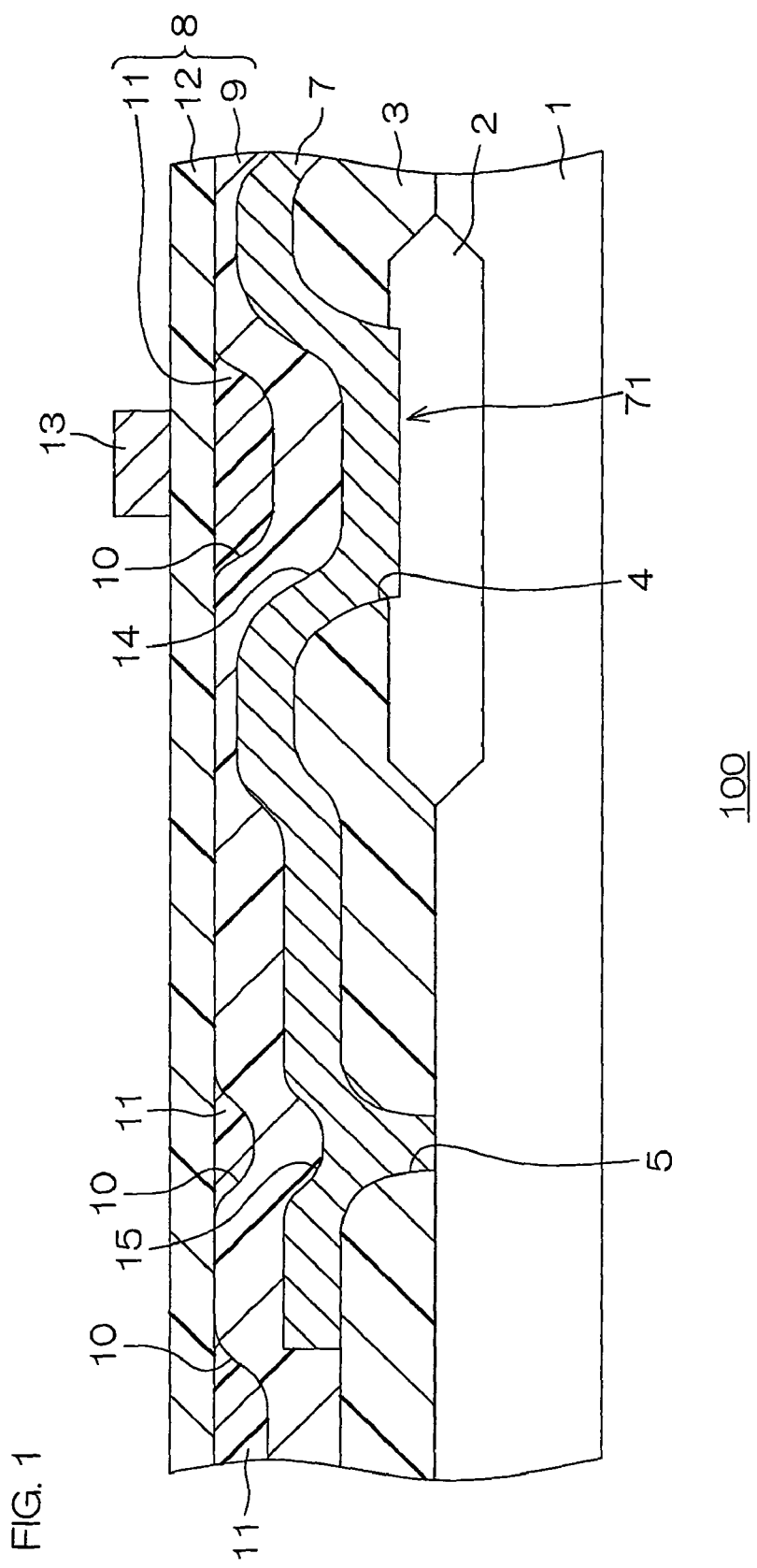
FIG. 1 is a schematic sectional view showing the structure of a semiconductor device according to a first embodiment of the present invention.

FIG. 1 is a schematic sectional view showing the structure of a semiconductor device according to a first embodiment of the present invention.

The semiconductor device 100 includes a semiconductor substrate 1. The semiconductor substrate 1 is made of Si (silicon), for example. Functional elements such as MOSFETS (Metal Oxide Semiconductor Field-Effect Transistors) are provided on a surface layer portion of the semiconductor substrate 1. A LOCOS film 2 for isolating the elements from each other is formed on the surface of the semiconductor substrate 1.

A first interlayer dielectric film 3 is formed on the semiconductor substrate 1. The first interlayer dielectric film 3 is made of $SiO_2$, for example. The first interlayer dielectric film 3 has a generally uniform thickness.

A lower wire 7 is formed on the first interlayer dielectric film 3. The lower wire 7 is made of Al (aluminum), for example. The lower wire 7 extends over the regions isolated from each other by the LOCOS film 2 across the LOCOS film 2 in plan view.

A second interlayer dielectric film 8 is formed on the first interlayer dielectric film 3 and the lower wire 7. The second interlayer dielectric film 8 covers the first interlayer dielectric film 3 and the lower wire 7.

An upper wire 13 is formed on the second interlayer dielectric film 8. The upper wire 13 is made of Al, for example. The pattern of the upper wire 13 is so designed as to intersect with a prescribed portion 71 of the lower wire 7 on the LOCOS film 2 in plan view.

A conductive material other than Al can alternatively be employed as the material for the lower wire 7 and the upper wire 13. Examples of the conductive material other than Al include Ti (titanium) and TiN (titanium nitride).

In the first interlayer dielectric film 3, a groove 4 is formed on a region including the prescribed portion 71 in plan view. The groove 4 is dug from the upper surface of the first interlayer dielectric film 3 to the upper surface of the LOCOS film 2, to pass through the first interlayer dielectric film 3 in the thickness direction (orthogonal to the surface of the semiconductor substrate 1). Therefore, the portion of the upper surface of the LOCOS film 2 facing the groove 4 provides the bottom surface of the groove 4. The prescribed portion 71 of the lower wire 7 enters the groove 4, to come into contact with the upper surface of the LOCOS film 2 forming the bottom surface of the groove 4.

A contact hole 5 is formed in the first interlayer dielectric film 3. The contact hole 5 is dug from the upper surface of the first interlayer dielectric film 3 to the surface of the region isolated by the LOCOS film 2, to pass through the first interlayer dielectric film 3 in the thickness direction. The lower wire 7 enters the contact hole 5, to be electrically connected with the semiconductor substrate 1 (region isolated by the LOCOS film 2).

The lower wire 7 so enters the groove 4 and the contact hole 5 that recesses 14 and 15 are formed in the upper surface of the lower wire 7 on the portions opposed to the groove 4 and the contact hole 5 respectively.

The second interlayer dielectric film 8 includes a base layer film 9 in contact with the first interlayer dielectric film 3 and the lower wire 7. The base layer film 9 is made of $SiO_2$, for example. The base layer film 9 has a generally uniform thickness. Therefore, a plurality of recesses 10 are formed on the upper surface of the base layer film 9 in response to steps formed by the recesses 14 and 15 and the upper surfaces of the first interlayer dielectric film 3 and the lower wire 7.

Each recess 10 is filled up with an embedded body 11. The embedded body 11 is made of $SiO_2$, for example. The embedded body 11 has a planar upper surface, which is flush with the surface of the base layer film 9. Thus, the overall upper surface of the structure consisting of the base layer film 9 and the embedded body 11 is planar.

The second interlayer dielectric film 8 further includes a surface layer film 12 stacked on the base layer film 9 and the embedded bodies 11. The surface layer film 12 is made of $SiO_2$, for example. The surface layer film 12 has a generally uniform thickness. The upper surfaces of the base layer film 9 and the embedded bodies 11 are planar and flush with one another, whereby the upper surface of the surface layer film 12 (upper surface of the second interlayer dielectric film 8) is planar on the overall region thereof.

Therefore, the thickness of the portion of the second interlayer dielectric film 8 located on the prescribed portion 71 of the lower wire 7 is larger than the thickness of the remaining portion of the second interlayer dielectric film 8 by the depth of the groove 4. In other words, the second interlayer dielectric film 8 is not entirely thickly formed but partially thickly formed on the prescribed portion 71 of the lower wire 7.

Therefore, the dielectric withstand voltage between the lower wire 7 and the upper wire 13 can be improved without entirely thickening (increasing the thickness of) the second interlayer dielectric film 8.

From another point of view, the dielectric withstand voltage between the lower wire 7 and the upper wire 13 depends on the thickness of the second interlayer dielectric film 8 on the prescribed portion 71 of the lower wire 7, and hence the thickness of the second interlayer dielectric film 8 on the portion of the lower wire 7 other than the prescribed portion 71 can be reduced while ensuring the insulation between the lower wire 7 and the upper wire 13 by setting the second interlayer dielectric film 8 to a thickness capable of maintaining the insulation between the lower wire 7 and the upper wire 13 on the prescribed portion 71 of the lower wire 7.

An insulating material other than $SiO_2$ can alternatively be employed as the material for the first interlayer dielectric film 3, the base layer film 9 and the surface layer film 12. Examples of the insulating material other than $SiO_2$ include SiC (silicon carbide), SiCN (silicon carbonitride) and SiN (silicon nitride).

FIGS. 2A to 2F are schematic sectional views showing the steps of manufacturing the semiconductor device shown in FIG. 1.

Figure 2A:
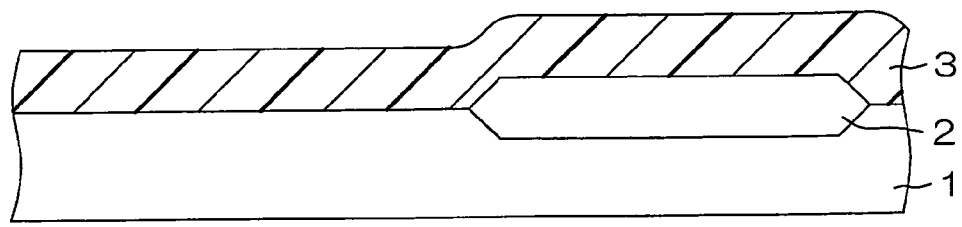
FIG. 2A is a schematic sectional view for illustrating a method of manufacturing the semiconductor device shown in FIG. 1.

In order to manufacture the semiconductor device 100, the LOCOS film 2 is first selectively formed on the surface of the semiconductor substrate 1 by thermal oxidation, as shown in FIG. 2A. Thereafter the first interlayer dielectric film 3 is formed on the semiconductor substrate 1 and the LOCOS film 2 by CVD (Chemical Vapor Deposition).

Figure 2B:
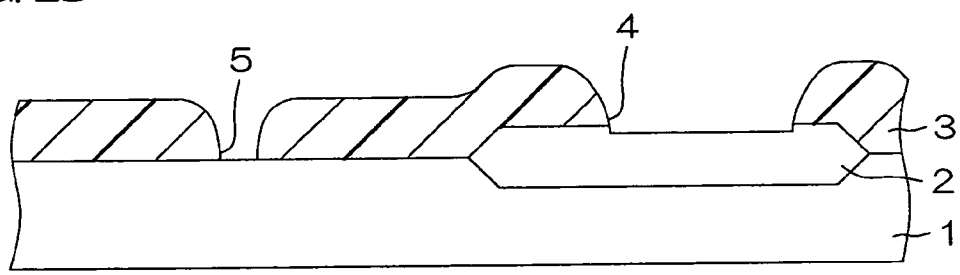
FIG. 2B is a schematic sectional view successively showing the step subsequent to the step shown in FIG. 2A.

Then, a mask (not shown) having openings corresponding to the contact hole 5 and the groove 4 is formed on the first interlayer dielectric film 3. The first interlayer dielectric film 3 is etched through this mask, whereby the groove 4 and the contact hole 5 are simultaneously formed in the first interlayer dielectric film 3, as shown in FIG. 2B. Therefore, the groove 4 can be formed without adding a step independent of the step of forming the contact hole 5.

The LOCOS film 2 is formed on the surface of the semiconductor substrate 1, whereby there is no apprehension that the trench 4 reaches the semiconductor substrate 1 even if the etching time is set in excess (in consideration of over etching) for reliably forming the contact hole 5. Consequently, the prescribed portion 71 of the lower wire 7 entering the groove 4 and the semiconductor substrate 1 can be prevented from conduction.

Figure 2C:
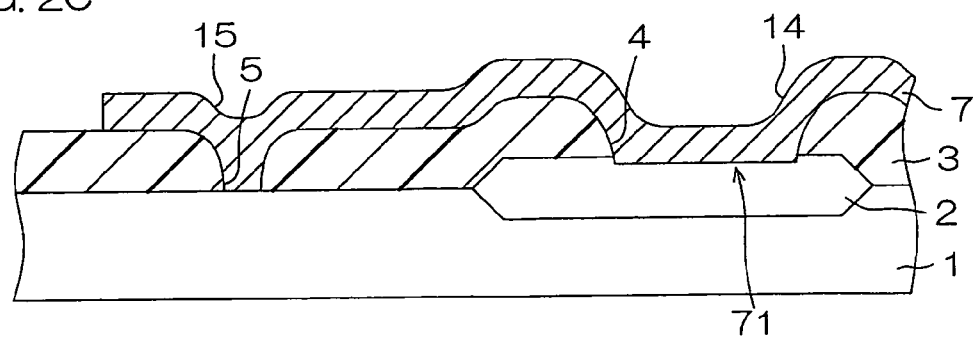
FIG. 2C is a schematic sectional view successively showing the step subsequent to the step shown in FIG. 2B.

Thereafter a metal film (not shown) made of Al is formed on the first interlayer dielectric film 3 including the groove 4 and the contact hole 5 by sputtering. Thereafter the metal film is selectively removed (patterned) by photolithography and etching. Thus, the lower wire 7 is formed as shown in FIG. 2C.

Figure 2D:
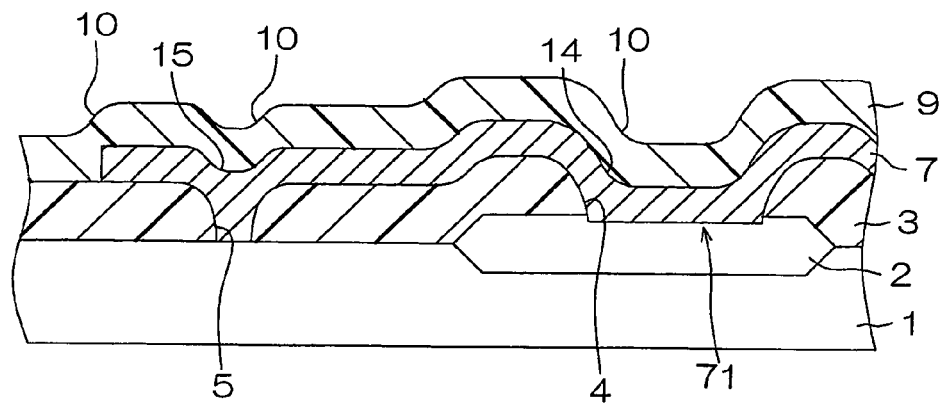
FIG. 2D is a schematic sectional view successively showing the step subsequent to the step shown in FIG. 2C.

Then, the base layer film 9 is formed on the first interlayer dielectric film 3 and the lower wire 7 by CVD, as shown in FIG. 2D.

Figure 2E:
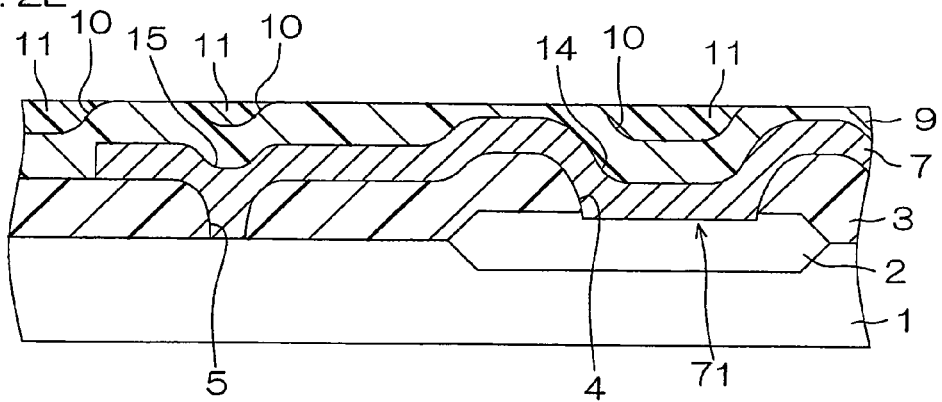
FIG. 2E is a schematic sectional view successively showing the step subsequent to the step shown in FIG. 2D.

Thereafter the embedded bodies 11 are embedded in the recesses 10 formed on the upper surface of the base layer film 9 by SOG (Spin On Glass) and etch-back, as shown in FIG. 2E. More specifically, the base layer film 9 is spin-coated with a solution prepared by dissolving $Si(OH)_4$ (silanol) in a solvent. Thereafter a glass film (not shown) is formed on the base layer film 9 by heat treatment. This glass film is etched back until the surface of the base layer film 9 is exposed, whereby the embedded bodies 11 are obtained with the upper surfaces flush with the upper surface of the base layer film 9. The portions of the glass film located outside the recesses 10 may alternatively be removed by CMP (chemical mechanical polishing), in place of the etch-back.

Figure 2F:
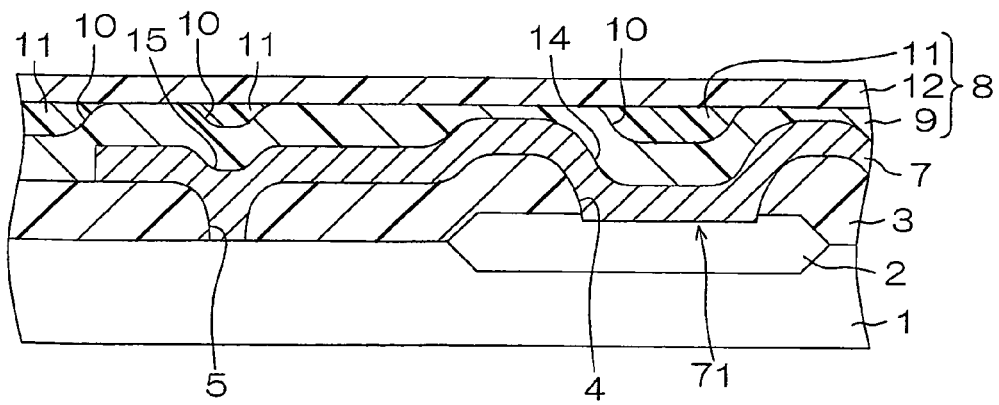
FIG. 2F is a schematic sectional view successively showing the step subsequent to the step shown in FIG. 2E.

Then, the surface layer film 12 is formed on the base layer film 9 and the embedded bodies 11 by CVD, as shown in FIG. 2F.

Then, a metal film (not shown) is formed on the surface layer film 12 by sputtering. Thereafter the metal film is selectively removed (patterned) by photolithography and etching. Thus, the upper wire 13 is formed, whereby the semiconductor device 100 shown in FIG. 1 can be obtained.

Figure 3:
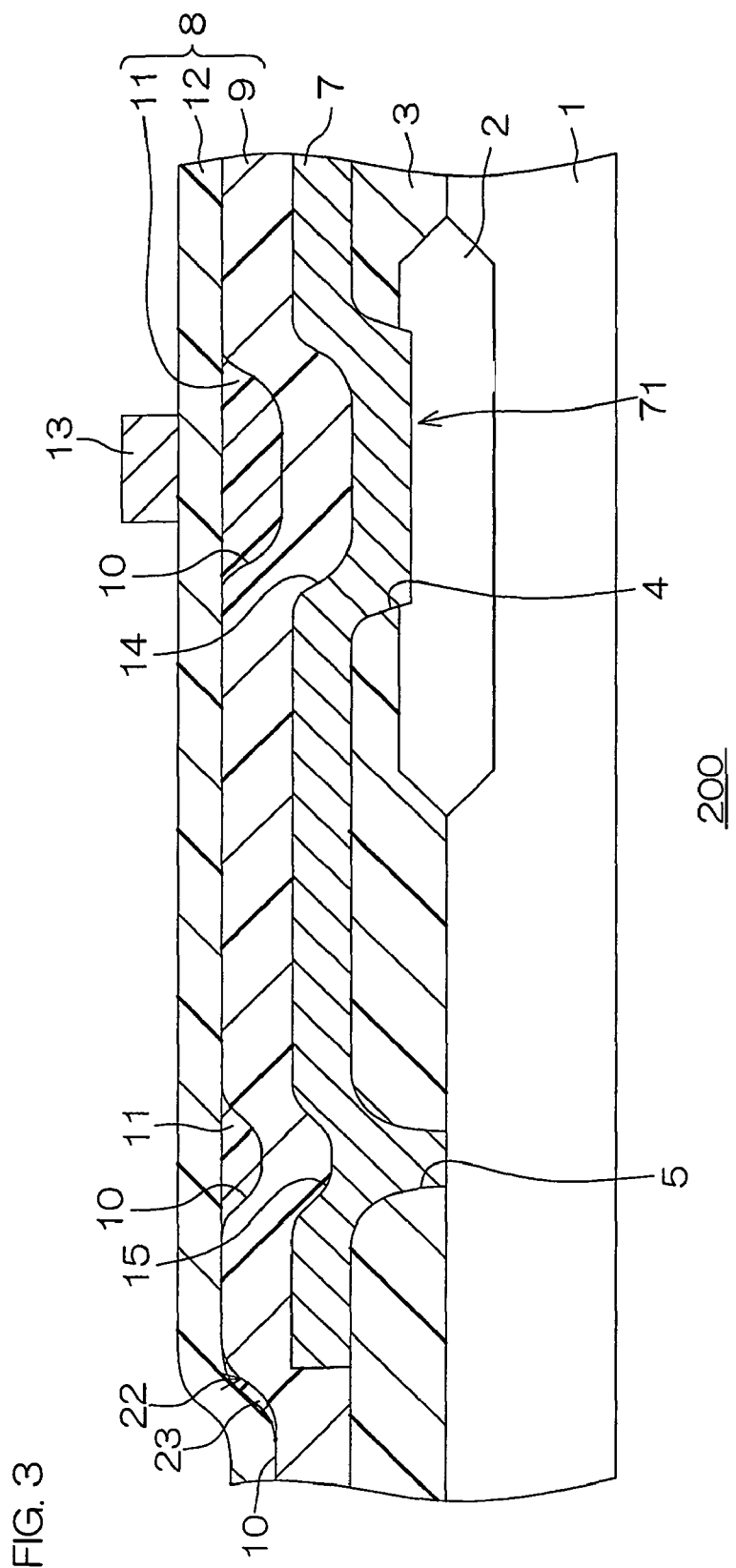
FIG. 3 is a schematic sectional view showing the structure of a semiconductor device according to a second embodiment of the present invention.
Figure 4:
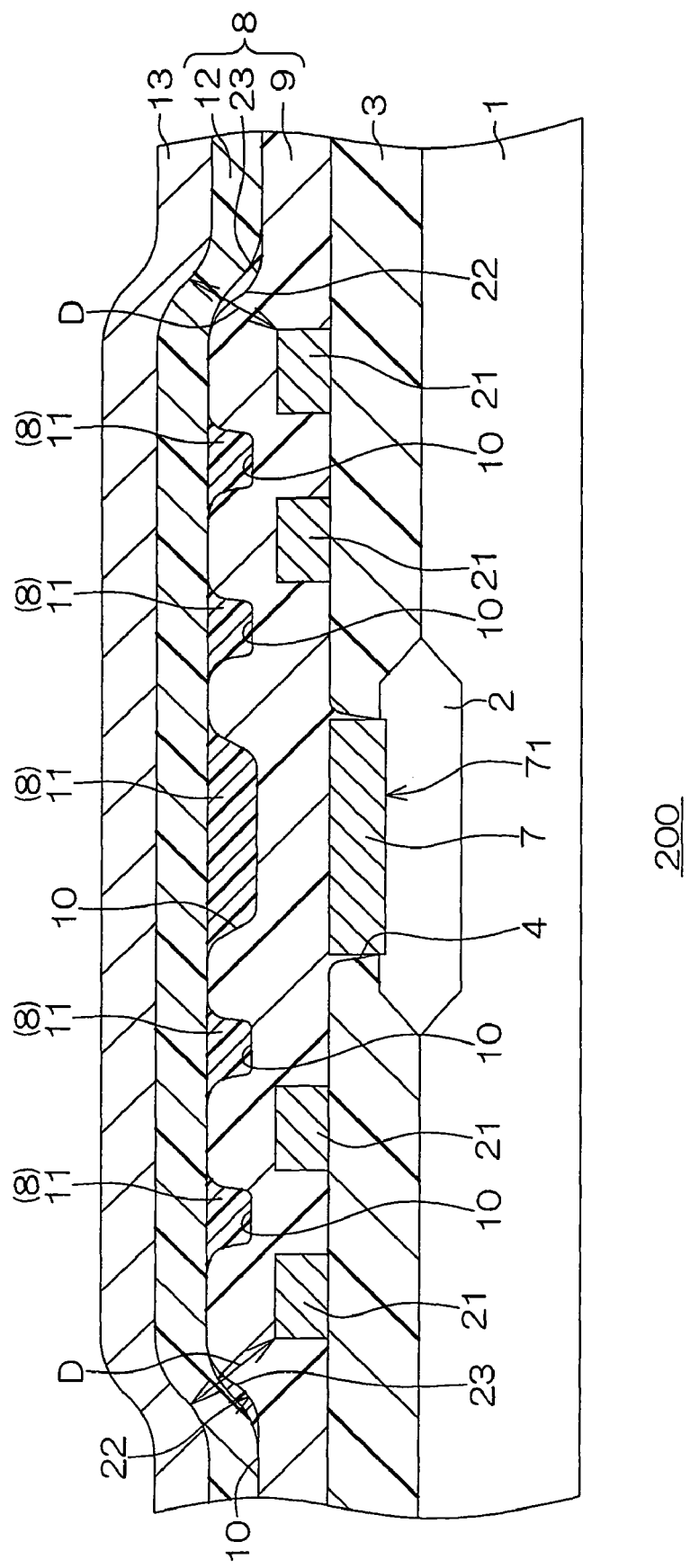
FIG. 4 is a sectional view of the semiconductor device shown in FIG. 3 taken along a section orthogonal to that shown in FIG. 3.

FIG. 3 is a schematic sectional view showing the structure of a semiconductor device according to a second embodiment of the present invention. FIG. 4 is a sectional view of the semiconductor device 200 shown in FIG. 3 taken along a section orthogonal to that shown in FIG. 3. Referring to FIGS. 3 and 4, portions corresponding to those shown in FIG. 1 are denoted by the same reference numerals as those in FIG. 1. The following description of the structure shown in FIGS. 3 and 4 is made with reference to points different from those of the structure shown in FIG. 1, and redundant description as to the portions corresponding to those shown in FIG. 1 is omitted.

In the semiconductor device 200 shown in FIGS. 3 and 4, a lower wire 7 and dummy wires 21 each having a thickness generally identical to that of the lower wire 7 are formed on a first interlayer dielectric film 3. Two pairs of dummy wires 21 are provided on both sides of a prescribed portion 71 of the lower wire 7 in an extensional direction (horizontal direction in the plane of FIG. 4) of the upper wire 13 respectively. On each side of the prescribed portion 71, the pair of dummy wires 21 are arranged at a proper interval therebetween, with a proper interval between the same and the lower wire 7.

The dummy wires 21 are formed in the step shown in FIG. 2C, simultaneously with the lower wire 7.

A plurality of recesses 10 are formed on the upper surface of the base layer film 9 of the second interlayer dielectric film 8. The recesses 10 formed in response to recesses 14 and 15 are filled up with embedded bodies 11. On the other hand, each recess 10 formed in response to the step between the upper surface of the first interlayer dielectric film 3 and each outermost dummy wire 21 (farther from the lower wire 7) has an inclined surface 22 rendering the portion of the base layer film 9 located outside the recess 10 and the bottom surface of the recess 10 continuous to each other.

The inclined surface 22 is covered with a coat 23 made of the same material as the embedded body 11. The coat 23 is formed only on the inclined surface 22, not to cancel the step between the portion of the upper surface of the base layer film 9 located outside the recess 10 and the bottom surface of the recess 10.

The embedded bodies 11 and the coats 23 can be formed by forming an insulating film having a generally uniform thickness on the base layer film 9 and etching back this insulating film until the upper surface of the first interlayer dielectric film 3 is exposed, for example. The recesses 10 formed in response to the recesses 14 and 15 are relatively small-sized, and hence the insulating film is so thickly formed that the upper surface of the insulating film can be prevented from formation of recesses resulting from the recesses 10.

Therefore, the upper surface of the surface layer film 12 of the second interlayer dielectric film 8 is planar on the lower wire 7 and the dummy wires 21, and not inclined on corners (intersections between the upper surface and the side surfaces) of the lower wire 7. Thus, the linear distance between the lower wire 7 and the upper surface of the second interlayer dielectric film 8 is not reduced below the thickness of the second interlayer dielectric film 8 in the portion located on the prescribed portion 71 of the lower wire 7.

Thus, the dummy wires 21 are so provided that the upper surface of the second interlayer dielectric film 8 can be prevented from inclining on the corners of the lower wire 7, and the dielectric withstand voltage between the lower wire 7 and the upper wire 13 can be further improved.

The pair of dummy wires 21 are formed on each side of the prescribed portion 71 of the lower wire 7. Even if the upper surface of the second interlayer dielectric film 8 is inclined on the corner of the outer dummy wire 21 and the portion of the upper wire 13 arranged on the inclined surface 22 and the outer dummy wire 21 are short-circuited due to dielectric breakdown, therefore, the outer dummy wire 21 and the lower wire 7 are not immediately short-circuited, due to the other dummy wire 21 interposed therebetween. Therefore, reliability against dielectric breakdown can be further improved between the lower wire 7 and the upper wire 13.

Figure 5:
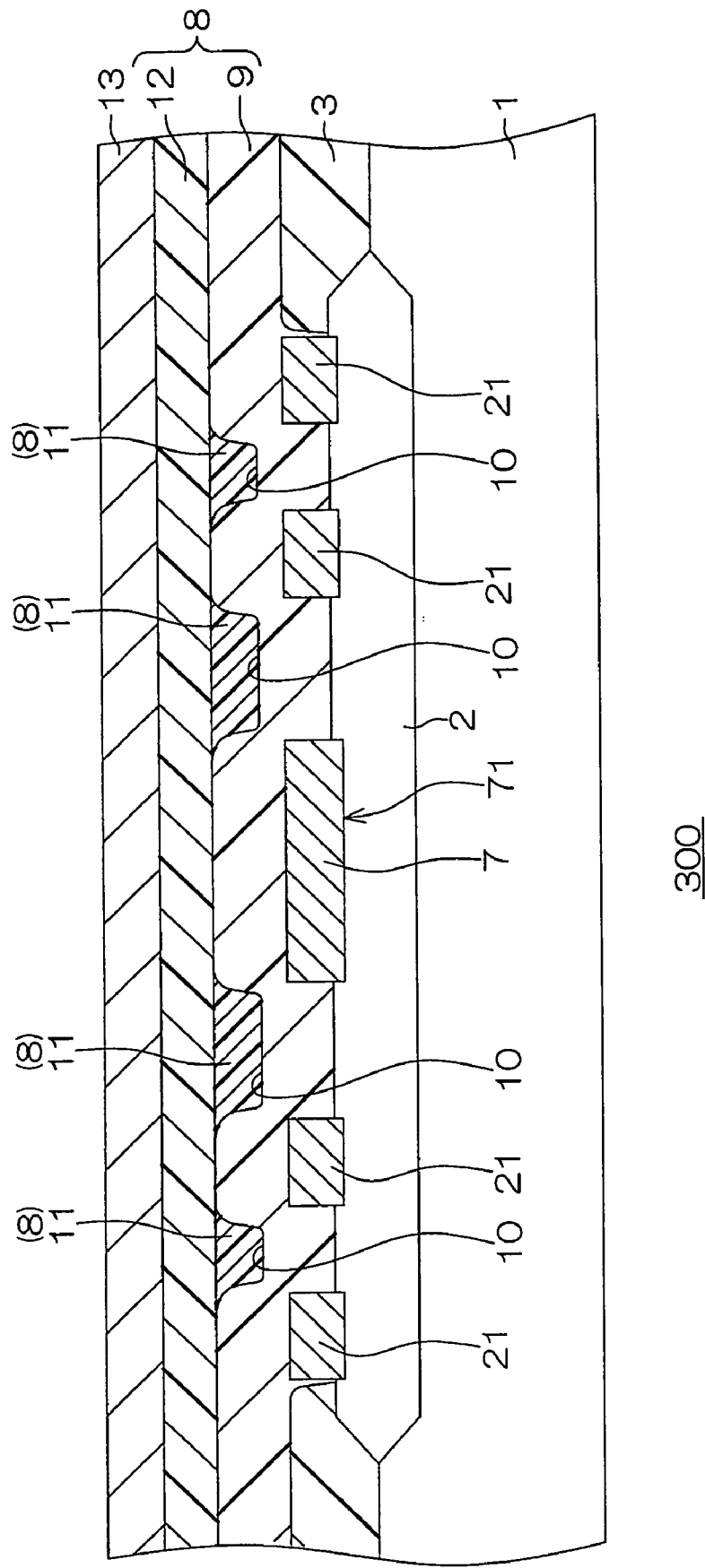
FIG. 5 is a schematic sectional view showing the structure of a semiconductor device according to a third embodiment of the present invention.

FIG. 5 is a schematic sectional view showing the structure of a semiconductor device according to a third embodiment of the present invention. Referring to FIG. 5, portions corresponding to those shown in FIG. 4 are denoted by the same reference numerals as those in FIG. 4. The following description of the structure shown in FIG. 5 is made with reference to points different from those of the structure shown in FIG. 4, and redundant description as to the portions corresponding to those shown in FIG. 4 is omitted.

In the semiconductor device 300 shown in FIG. 5, a LOCOS film 2 is sized to be opposed to a prescribed portion 71 of a lower wire 7 and dummy wires 21. A groove 4 is formed on a region including the prescribed portion 71 and the dummy wires 21 in plan view. The prescribed portion 71 of the lower wire 7 and the dummy wires 21 enter the groove 4, to come into contact with the upper surface of the LOCOS film 2 forming the bottom surface of the groove 4.

According to this structure, the dummy wires 21 so enter the groove 4 as to reduce steps between the upper surfaces thereof and the upper surface of a first interlayer dielectric film 3. Therefore, a second interlayer dielectric film 8 (surface layer film 12) has a planar upper surface on a corner of each outer dummy wire 21. Thus, a large distance can be ensured between the corner of the outer dummy wire 21 and the upper surface of the second interlayer dielectric film 8, whereby an upper wire 13 and the outer dummy wire 21 can be prevented from short circuiting resulting from dielectric breakdown.

Figure 6:
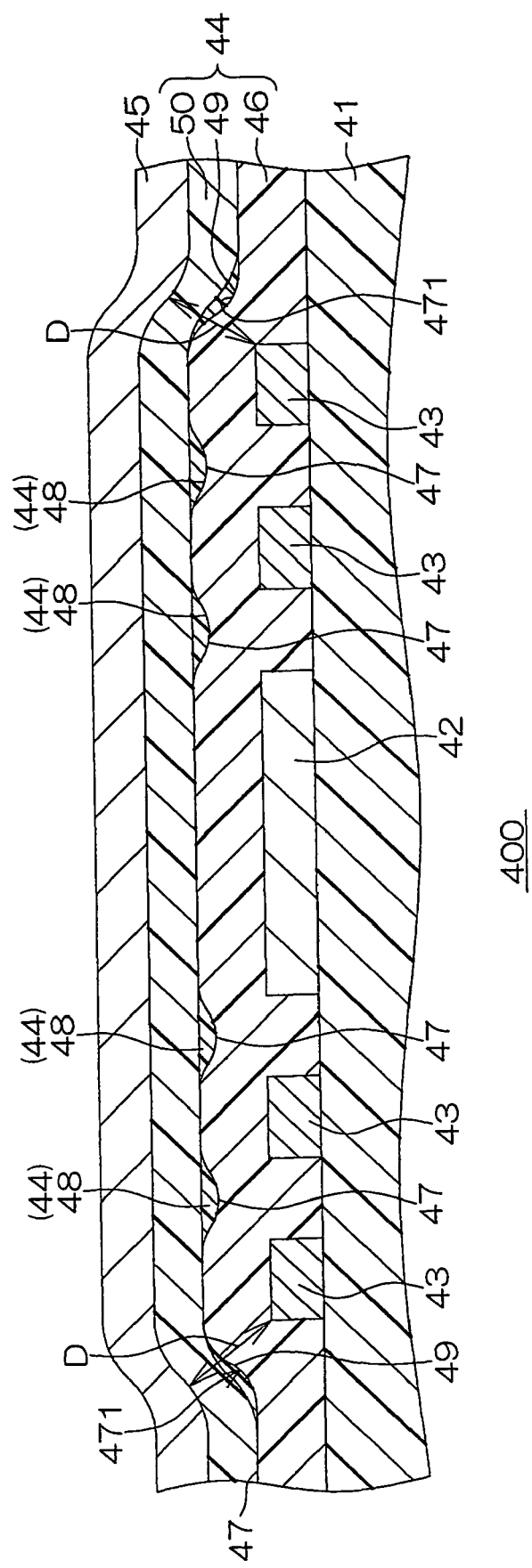
FIG. 6 is a schematic sectional view showing the structure of a semiconductor device according to a fourth embodiment of the present invention.

FIG. 6 is a schematic sectional view showing the structure of a semiconductor device according to a fourth embodiment of the present invention.

The semiconductor device 400 includes a semiconductor substrate (not shown). This semiconductor substrate is formed by an Si substrate, for example. Functional elements such as MOSFETS are provided on a surface layer portion of the semiconductor substrate.

A first interlayer dielectric film 41 is formed on the semiconductor substrate. The first interlayer dielectric film 41 is made of $SiO_2$, for example, and formed by CVD.

A lower wire 42 is formed on the first interlayer dielectric film 41. Two pairs of dummy wires 43 are formed on the first interlayer dielectric film 41 on both sides of the lower wire 42 respectively. The lower wire 42 and the dummy wires 43 are made of Al, for example, and simultaneously formed by selectively removing (patterning) a metal film formed on the first interlayer dielectric film 41 by sputtering. The metal film is selectively removed by photolithography and etching.

A second interlayer dielectric film 44 is stacked on the first interlayer dielectric film 41, the lower wire 42 and the dummy wires 43.

An upper wire 45 is formed on the second interlayer dielectric film 44. The upper layer 45 is made of Al, for example, and simultaneously formed by selectively removing (patterning) a metal film formed on the second interlayer dielectric film 44 by sputtering. The metal film is selectively removed by photolithography and etching.

Figure 7:
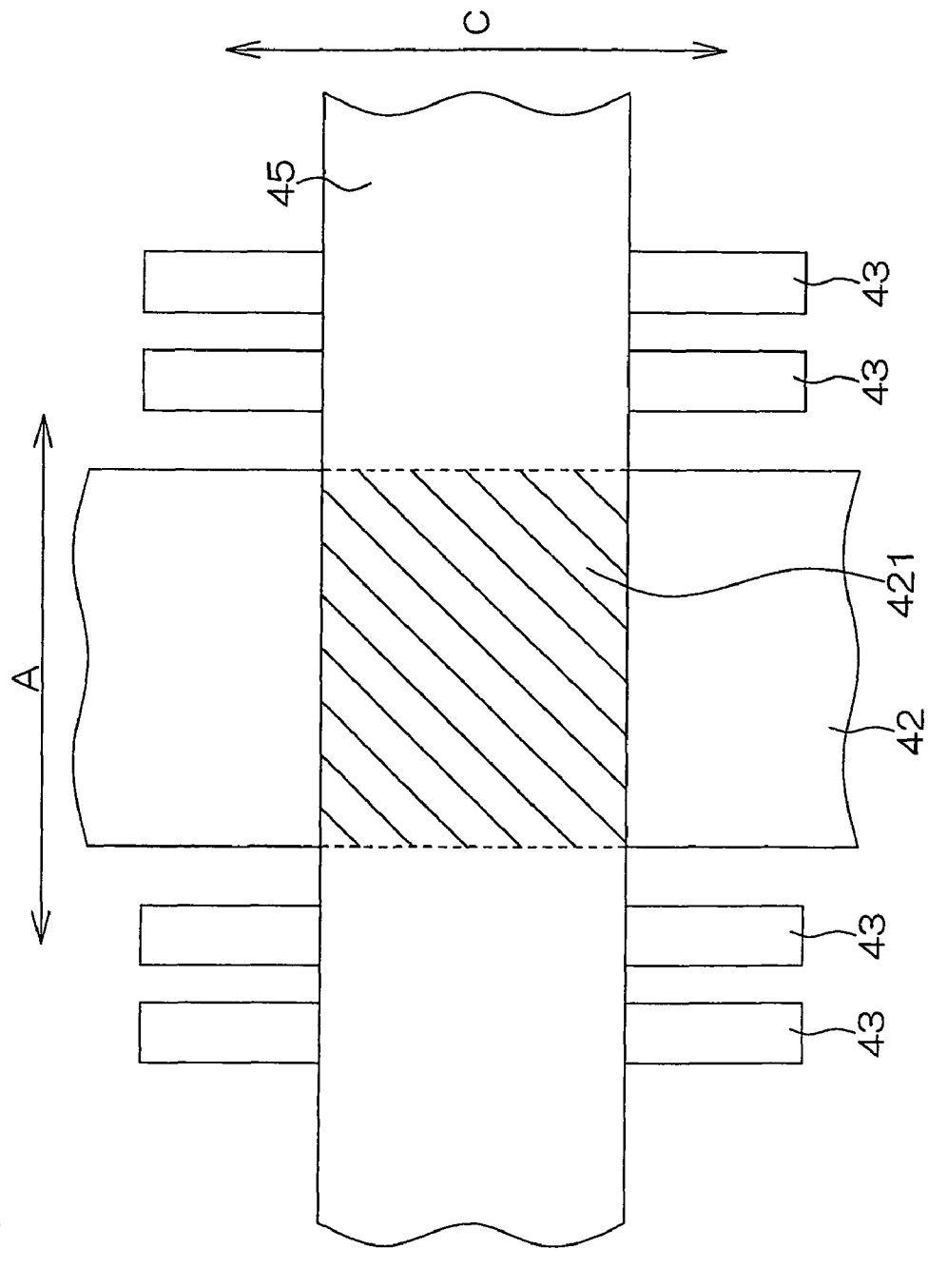
FIG. 7 is a schematic plan view of a lower wire, dummy wires and an upper wire shown in FIG. 6.

FIG. 7 is a schematic plan view of the lower wire, the dummy wires and the upper wire shown in FIG. 6.

The lower wire 42 and the upper wire 45 have portions intersecting with each other in plan view respectively. In other words, the upper wire 45 extends in a prescribed direction (intersecting with an extensional direction C of the lower wire 42) A above a prescribed portion 421 (shown in a hatched manner in FIG. 7) of the lower wire 42, and intersects with the prescribed portion 421 in plan view.

The dummy wires 43 are in the form of rectangles extending along the extensional direction C of the lower wire 42 longer than the width of the upper wire 45. According to this embodiment, two pairs of dummy wires 43 are provided on both sides of the prescribed portion 421 along the prescribed direction A respectively. On each side of the prescribed portion 421, the pair of dummy wires 43 are arranged at a proper interval therebetween, with a proper interval between the (inner) dummy wire 43 closer to the lower wire 42 and the lower wire 42.

Referring to FIG. 6, the second interlayer dielectric film 44 includes a base layer film 46 in contact with the first interlayer dielectric film 41, the lower wire 42 and the dummy wires 43. The base layer film 46 is made of $SiO_2$, for example, and formed by CVD. The base layer film 46 has a generally uniform thickness. Therefore, a plurality of recesses 47 are formed on the upper surface of the base layer film 46 in response to steps formed by the upper surface of the first interlayer dielectric film 41 and those of the lower wire 42 and the dummy wires 43.

Recesses 47 concaved toward the spaces between the lower wire 42 and the dummy wires 43 and those between the adjacent dummy wires 43 are filled up with embedded bodies 48. The embedded bodies 48 are made of $SiO_2$, for example. The embedded bodies 48 have planar upper surfaces, which are flush with the surface of the base layer film 46.

Each recess 47 formed in response to the step between the upper surface of the first interlayer dielectric film 41 and each outermost dummy wire 43 has an inclined surface 471 rendering the portion of the base layer film 46 located outside the recess 47 and the bottom surface of the recess 47 continuous to each other. The inclined surface 471 is so inclined as to approach onto the first interlayer dielectric film 41 from the outer dummy wire 43. The inclined surface 471 is covered with a coat 49 made of the same material as the embedded body 48. The coat 49 is formed only on the inclined surface 471, not to cancel the step between the portion of the upper surface of the base layer film 46 located outside the recess 47 and the bottom surface of the recess 47. The coat 49 is so provided that the surface of the portion of the base layer film 46 located on the outer dummy wire 43 and the surface of the portion of the base layer film 46 located on the first interlayer dielectric film 41 are smoothly continuous to each other (with a small inclination).

The embedded body 48 and the coat 49 can be formed by forming an insulating film having a generally uniform thickness on the base layer film 46 and etching back this insulating film until the upper surface of the first interlayer dielectric film 41 is exposed, for example. The insulating film is formed by SOG with $Si(OH)_4$, for example.

The second interlayer dielectric film 44 further includes a surface layer film 50 covering the base layer film 46, the embedded bodies 48 and the coats 49. The surface layer film 50 is made of SiO$_2$, for example, and formed by CVD. Inclined surfaces corresponding to the inclined surfaces 471 (upper surfaces of the coats 49) of the base layer film 46 are formed on the upper surface of the surface layer film 50.

Thus, the lower wire 42 and the dummy wires 43 are formed on the first interlayer dielectric film 41, and covered with the second interlayer dielectric film 44. The upper wire 45 extending in the prescribed direction A and intersecting with the prescribed portion 421 of the lower wire 42 in plan view is formed on the second interlayer dielectric film 44. Two pairs of dummy wires 43 are provided on both sides of the prescribed portion 421 along the prescribed direction A respectively, and arranged at an interval from each other on each side.

The inclined surface corresponding to that (inclined surface 471 of the base layer film 46) formed by the step between the upper surface of each outer dummy wire 43 and the upper surface of the first interlayer dielectric film 41 is formed on the surface of the second interlayer dielectric film 44. Therefore, the minimum distance D between the outer dummy wire 43 and the upper wire 45 is smaller than the thickness of the second interlayer dielectric film 44, and there is an apprehension that the outer dummy wire 43 and the upper wire 45 are short-circuited if a high voltage (not less than 100 V, for example) is applied to the upper wire 45. However, the other dummy wire 43 is interposed between the outer dummy wire 43 and the lower wire 42, and hence the outer dummy wire 43 and the lower wire 42 are not immediately short-circuited even if the outer dummy wire 43 and the upper wire 45 are short-circuited. Therefore, the insulation between the lower wire 42 and the upper wire 45 can be maintained. Thus, the dielectric withstand voltage between the lower wire 42 and the upper wire 45 can be improved without thickening (increasing the thickness of) the second interlayer dielectric film 44.

Further, the inclined surface 471 is covered with the coat 49. Thus, the minimum distance D between the outer dummy wire 43 and the upper wire 45 is increased, whereby the dielectric withstand voltage therebetween can be further improved.

In addition, the recesses 47 are formed on the surface of the second interlayer dielectric film 44, due to the shapes of the lower wire 42 and the dummy wires 43. The recesses 47 are so filled up with the embedded bodies 48 that the surface of the second interlayer dielectric film 44 (surface layer film 50) is planar on the lower wire 42. On the portion where the lower wire 42 and the upper wire 45 intersect with each other in plan view, therefore, the upper wire 45 can be formed in a planar manner. Consequently, the minimum distance between the lower wire 42 and the upper wire 45 is increased, whereby the dielectric withstand voltage therebetween can be improved.

Three or more dummy wires 43 may alternatively be provided on each wide of the prescribed portion 421 of the lower wire 42 along the prescribed direction A.

Figure 8:
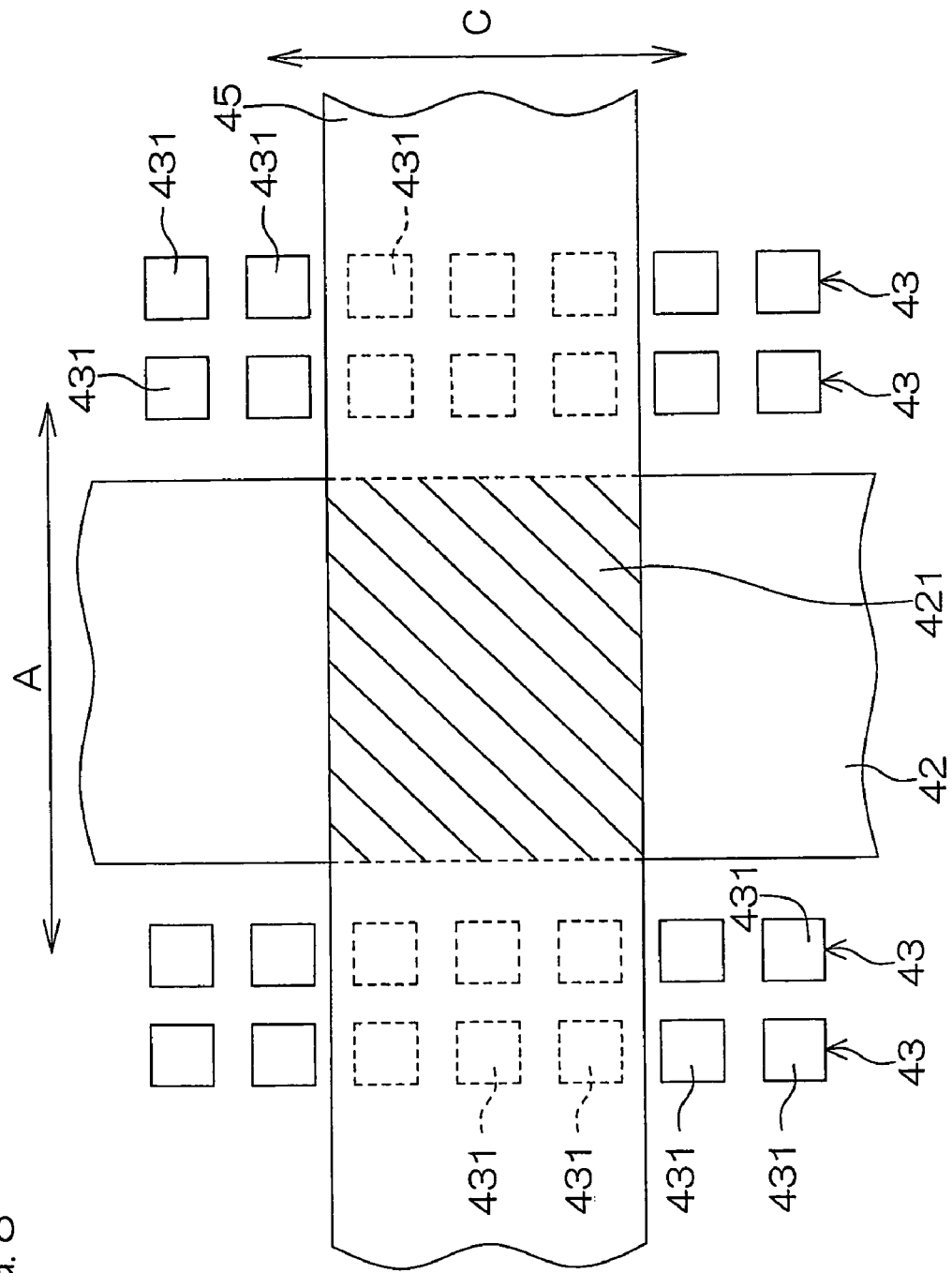
FIG. 8 is a schematic plan view showing a modification of the dummy wires.
Figure 9:
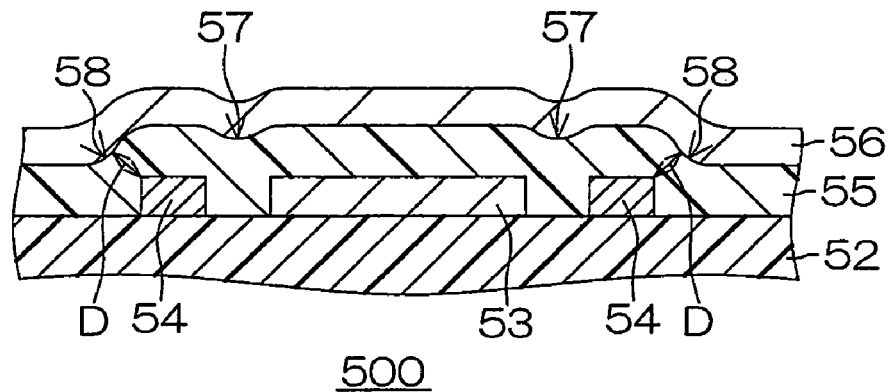
FIG. 9 is a schematic sectional view showing the structure of a conventional semiconductor device.
Figure 10:
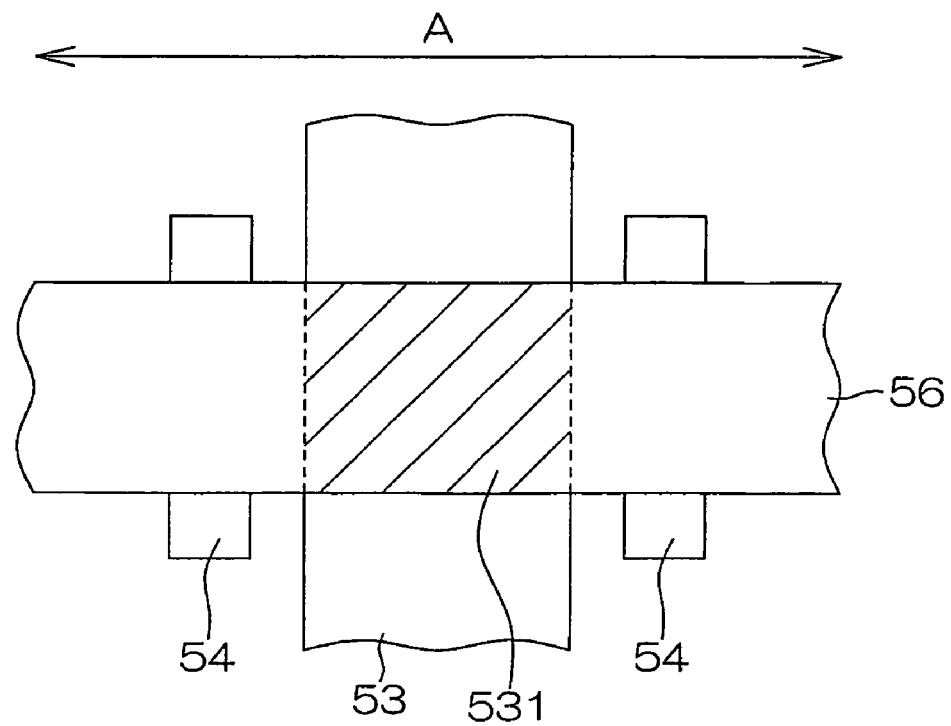
FIG. 10 is a schematic plan view of a lower wire and an upper wire shown in FIG. 9.

Further, each dummy wire 43 may be divided into a plurality of portions 431 rectangular in plan view, as shown in FIG. 8. The divided portions 431 are arranged at generally regular intervals in the extensional direction C. In other words, the plurality of divided portions 431 rectangular in plan view are arranged on both sides of the prescribed portion 421 in the form of rows and columns separated from one another at proper intervals in the prescribed direction A and the extensional direction C. The divided portions 431 of each column arranged along the extensional direction C correspond to the dummy wires 43 rectangular in plan view, and effects similar to those of the structure shown in FIG. 7 can be attained also according to the structure shown in FIG. 8.

An insulating material other than SiO$_2$ can alternatively be employed as the material for the first interlayer dielectric film 41, the base layer film 46 and the surface layer film 50. Examples of the insulating material other than SiO$_2$ include SiC, SiCN and SiN.

A conductive material other than Al can be employed as the material for the lower wire 42, the dummy wires 43 and the upper wire 45. Examples of the conductive material other than Al include Ti and TiN.

While the present invention has been described in detail by way of the embodiments thereof, it should be understood that these embodiments are merely illustrative of the technical principles of the present invention but not limitative of the invention. The spirit ad scope of the present invention are to be limited only by the appended claims.

This application corresponds to Japanese Patent Application No. 2007-205628 filed in the Japanese Patent Office on Aug. 7, 2007, Japanese Patent Application No. 2007-213694 filed in the Japanese Patent Office on Aug. 20, 2007 and Japanese Patent Application No. 2008-202147 filed in the Japanese Patent Office on Aug. 5, 2008, the disclosures of which are incorporated herein by reference in its entirety.

What is claimed is:

1. A semiconductor device including:
    a substrate;
    an insulating portion on the substrate;
    a first interlayer dielectric film on the insulating portion;
    a lower wire formed on the first interlayer dielectric film;
    a second interlayer dielectric film formed on the first interlayer dielectric film and the lower wire; and
    an upper wire formed on the second interlayer dielectric film,
    wherein the first interlayer dielectric film is provided with a groove dug from the upper surface thereof, the groove exposing a part of the insulating portion over a whole width of the groove,
    the lower wire is formed on a region over a first side and a second side of the groove, the region including inside of the groove,
    a width of the upper wire is smaller than the width of the groove,
    at least a portion of the second interlayer dielectric film formed on the lower wire in the groove has a planar upper surface, and
    the upper wire is formed on the planar upper surface so that the upper wire, throughout a width direction thereof, overlaps with the lower wire in the groove in plan view.

2. The semiconductor device according to claim 1, further including a semiconductor substrate whose surface is covered with the first interlayer dielectric film, wherein
    a contact hole for electrically connecting the lower wire and the semiconductor substrate with each other is penetratingly formed in the first interlayer dielectric film, and
    an insulating portion facing the groove so that the upper surface thereof provides the bottom surface of the groove is formed on the surface of the semiconductor substrate.

3. The semiconductor device according to claim 1, wherein the interlayer dielectric film includes a base layer film, having a uniform thickness, in contact with the first interlayer dielectric film and the lower wire, and an embedded body embedded in a recess formed in the upper surface of the base layer film correspondingly to the groove so that the upper surface thereof is flush with the upper surface of the base layer film outside the groove.

4. The semiconductor device according to claim 1, wherein the upper surface of the second interlayer dielectric film is entirely planar.

5. The semiconductor device according to claim 1, wherein a shortest distance between the lower wire and a first end of the upper wire in a width direction thereof is equal to a shortest distance between the lower wire and a second end of the upper wire in the width direction.

6. The semiconductor device according to claim 1, further including dummy wires formed on positions opposed to the upper wire on both sides of the prescribed portion in a direction where the upper wire extends on the prescribed portion.

7. The semiconductor device according to claim 6, wherein a plurality of dummy wires are provided on each side of the prescribed portion.

* * * * *